United States Patent [19]
Winters

[11] Patent Number: 5,675,285
[45] Date of Patent: Oct. 7, 1997

[54] MULTICHANNEL PREDISTORTION LINEARIZER FOR MULTIPLE AMPLIFIERS WITH MULTIPLE ANTENNAS

[75] Inventor: Jack H. Winters, Middletown, N.J.

[73] Assignee: Lucent Technologies Inc., Murray Hill, N.J.

[21] Appl. No.: 576,149

[22] Filed: Dec. 21, 1995

[51] Int. Cl.$^6$ ....................................................... H03F 3/68
[52] U.S. Cl. ...................... 330/124 R; 330/149; 330/295
[58] Field of Search ............................ 330/124 R, 149, 330/295; 342/373; 343/701, 778

[56] References Cited

U.S. PATENT DOCUMENTS 5,568,088  10/1996  Dent et al. ............................... 330/151

Primary Examiner—James B. Mullins

[57] ABSTRACT

The peaking of multiple input signals applied to the inputs of two or more distinct amplifiers, and the resultant intermodulation, can be reduced, or avoided, by: a) dividing each of the input signals into components from which the original input signals can be reconstructed, e.g., by using a Butler matrix of order greater than 2×2; b) developing a specially constructed signal which is likewise divided into components; c) supplying a component of each of the input signals and a component of the specially constructed signal to at least one of the amplifiers; and d) constructing amplified versions of the original input signals from the outputs of the amplifiers, e.g., by using another identical Butler matrix. The specially constructed signal is generated so as to reduce: 1) peaking at the one of amplifiers whose input signal peaking results in the highest peak during a particular time period; and 2) intermodulation in the output signals. The input signals may each be a modulated carrier signal and each of the amplified versions of the original input signals is supplied to a different antenna for transmission. The specially constructed signal can range over the entire bandwidth of the signals being amplified while the amplified version of it may be discarded, e.g., not supplied to any antenna.

42 Claims, 3 Drawing Sheets

MULTICHANNEL PREDISTORTION LINEARIZER FOR MULTIPLE AMPLIFIERS WITH MULTIPLE ANTENNAS

TECHNICAL FIELD

This invention relates to means and methods for reducing distortion that can result when multiple input signals, such as are employed by wireless communication systems, are amplified by an amplification system.

BACKGROUND OF THE INVENTION

Multiple input signals, each modulated by a different carrier, are often coupled to separate amplifiers in wireless communication systems. Each resulting amplified signal is then transmitted via a separate antenna. In such systems, it is necessary to avoid the signal distortion that results when any of the amplifiers are operated outside of its linear operating region. Therefore, the maximum signal power of each of the input signals is limited so that the product of the input signal and the gain of the amplifier to which it is supplied is equal to the maximum output power of the amplifier's linear operating region. As such, each amplifier is operated with an average output power that is considerably less than the maximum output power it can supply. However, since the average power of each of the input signals is less than its maximum power most of the time the available gain in the linear region of each of the amplifiers is wasted.

Thus, it has been recognized in the art that it would be desirable for the input signals to share all the amplifiers available for amplification by applying more than one input signal to at least one of the amplifiers. Doing so would allow the amplifiers to be sized based more on the average power, rather than the maximum power, of each signal. However, a combined input signal that has an instantaneous input signal power that drives the amplifier beyond its linear operating region may result when multiple signals that are input to an amplifier align in phase. Such a phase alignment of input signals that drives an amplifier beyond its linear operating region is referred to in the art as "peaking", because of the resulting local peak of the input signal power. Peaking can result in both undesirable distortion and intermodulation, and, as is well known, intermodulation increases as the output power of an amplifier approaches its maximum.

For example, when N input signals are applied to a single amplifier, each input signal having a maximum amplitude into the amplifier of one (1), the average power of each input signal is 1/2 and the total input power into the amplifier averaged over all possible phases of the N signals is N/2. However, when peaking occurs, so that all the signals align in phase, the total input signal amplitude of the N signals is N, and the total input power is $N^2/2$. Thus, peaking can increase the input signal power by up to N times. Consequently, the amplifier must operate at an average output power of 1/N of its maximum linear output power limit to avoid peaking induced distortion and intermodulation. When so operated each input signal has a maximum power of only 1/N times what it could otherwise be without peaking, which results in a loss of the advantage due to trunking efficiency.

Intermodulation caused by operating an amplifier outside of its linear range may be reduced by using known methods that include: a) a feedforward, postcompensation technique; and b) a feedback, precompensation technique. However, the former technique typically uses extensive analog circuitry and is very sensitive to amplifier gain variation while the performance of the latter technique depends on the accuracy of the analog circuitry that is used.

Thus, although it seems desirable to share amplifiers, to decrease the required maximum power of the amplifiers, such sharing can result in peaking, which limits the advantage due to sharing.

SUMMARY OF THE INVENTION

Applicant's invention resides, in part, in the recognition that when multiple input signals share two or more distinct amplifiers, peaking, and the resultant intermodulation, can be reduced or avoided by: a) dividing each of the input signals into components from which the original input signals can be reconstructed; b) developing a specially constructed signal which is likewise divided into components; c) supplying a component of each of the input signals and a component of the specially constructed signal to at least one of the amplifiers; and d) constructing amplified versions of the original input signals from the outputs of the amplifiers. The specially constructed signal can range over the entire bandwidth of the signals being amplified and, in accordance with an aspect of the invention, the amplified version of it, if developed, may be discarded. Additionally, in accordance with another aspect of the invention, the specially constructed signal is generated so as to reduce the peaking experienced at at least one of the amplifiers, e.g., the amplifier whose input signal peaking results in the highest peak during a particular time period.

In an exemplary embodiment of the invention, a) a first Butler matrix is used to evenly split among several amplifiers 1) the input signals to be amplified and 2) a specially constructed peaking reduction signal, and b) the output signals for transmission are generated by recombining the signals supplied from the amplifiers using a second Butler matrix that is substantially similar to the first Butler matrix. Since the signal input into each input port of the first Butler-matrix comes out only from a respective corresponding output port of the second Butler-matrix, but passes through every amplifier, in accordance with an aspect of the invention, the peaking reduction signal can be added to an input port corresponding to a nontransmitting output port, i.e., an output port the signal from which is not supplied to an antenna. Thus, the peaking reduction signal can range over the entire bandwidth of the signals being amplified and a component of the constructed signal can be passed as part of the input signal of each amplifier, to affect the peaking of the signals input to the amplifiers, without any component of the constructed signal being ultimately transmitted. The Butler matrices may be implemented a) using analog circuitry; or b) digitally, with the input signals modulated after passing through the first Butler matrix to produce modulated amplifier input signals.

DETAILED DESCRIPTION

In accordance with the principles of the invention, peaking, and the resultant intermodulation, can be reduced or avoided when multiple signals share an amplification capability that is made up of two or more distinct amplifiers by: a) dividing each of the input signals into components from which the original input signals can be reconstructed; b) developing a specially constructed signal which is likewise divided into components; c) supplying a component of each of the input signals and a component of the specially constructed signal to each of the amplifiers; and d) constructing amplified versions of the of the original signals from the outputs of the amplifiers.

Figure 1:
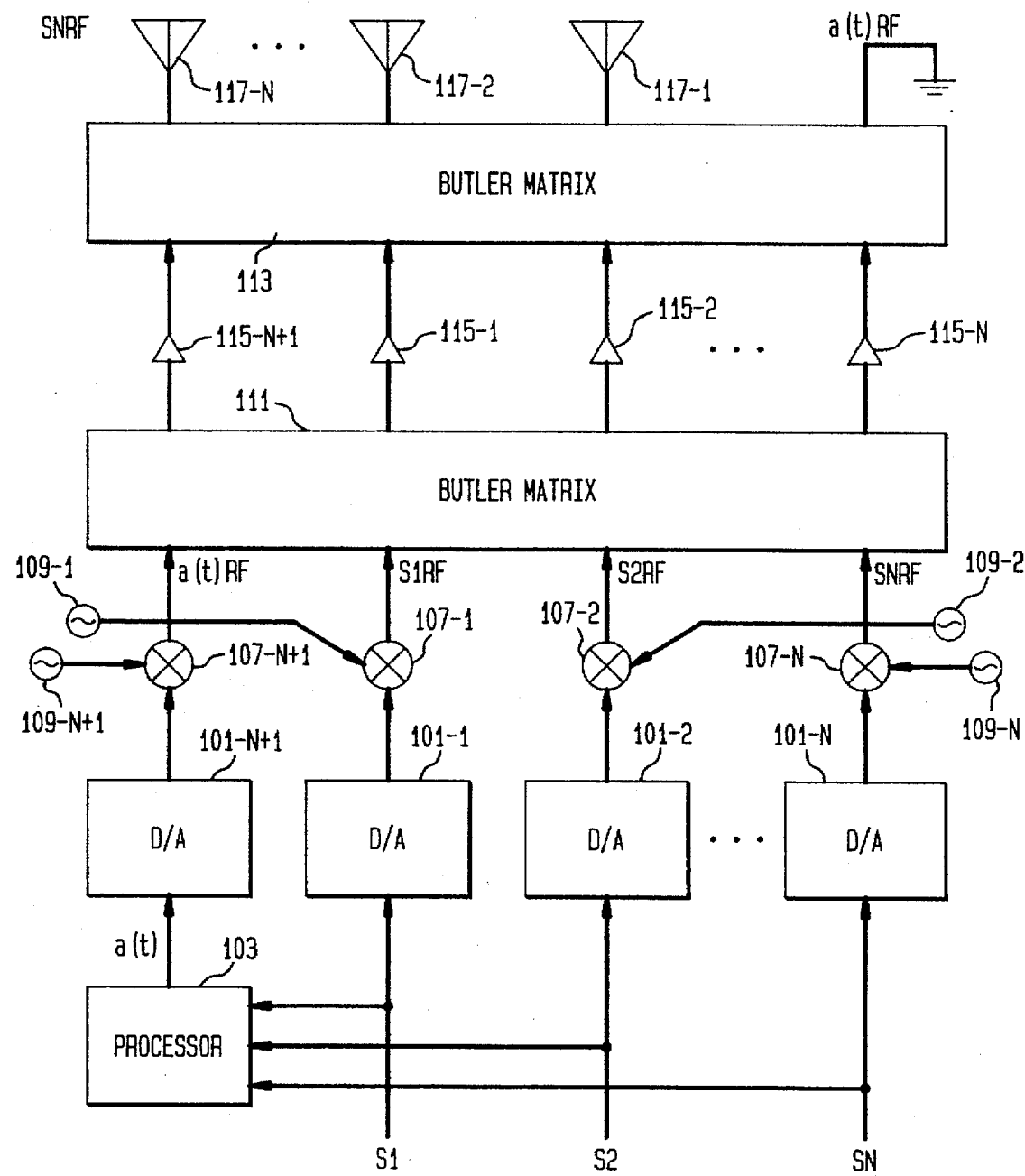
FIG. 1 is a block diagram of an exemplary Butler matrix-based system for reducing distortion and intermodulation embodying the invention.

FIG. 1 shows an exemplary embodiment of the invention for reducing peaking and intermodulation using Butler matrices to divide signals into components and to construct amplified versions of these signals. In particular, shown in FIG. 1 are: a) N digital signals, N>2, S1 through SN; b) N+1 digital to analog (D/A) converters 101, including D/A converters 101-1 to 101-N+1; c) processor 103; d) N+1 modulators 107; including 107-1 to 107-N+1; e) N+1 carrier signal generators 109, including carrier signal generators 109-1 to 109-N+1, f) N+1×N+1 Butler matrices 111 and 113, which are each [N+1]×[N+1]; g) N+1 amplifiers 115, including amplifier 115-1 to amplifier 115-N+1; and h) antennas 117, including antennas 117-1 to 117-N. Note that in FIG. 1 arrows indicate the direction of signal flow.

Each of digital signals S1 through SN are, for example, the digital signals generated by a wireless communication base station for each of the uplink channels served by the wireless communication base station. These signals are baseband signals or their digital representation. Digital signals S1 through SN are each supplied to a respective one of digital to analog (D/A) converters 101-1 to 101-N. This may be after an optional delay to allow for the generation of a(t). Each of digital to analog (D/A) converters 101-1 to 101-N develops an analog signal representing the information in the one of digital signals S1 through SN supplied thereto.

Each of digital signals S1 through SN are also supplied to processor 103. Processor 103 may be a conventional digital signal processor (DSP), other suitable processing systems, or even a ROM. As described below, processor 103 generates a digital output signal a(t) as a function of: a) digital signals S1 through SN; and b) optionally, information relating to the frequencies and phases of the carrier signals generated by carrier signal generators 109, which may be prestored in processor 103 or supplied thereto as additional inputs. In particular, this is done by taking into account the transfer functions encountered by S1 through SN, e.g., the transfer functions of Butler matrices 111 and 113 and each of amplifiers 115, which are available to processor 103. The digital output signal a(t) is supplied from processor 103 to digital to analog (D/A) converter 101-N+1, which develops an analog signal representing a(t).

Each analog signal developed by each one of digital to analog (D/A) converters 101 is supplied as an output to its corresponding respective, e.g., identified by the same suffix, one of modulators 107. Each one of modulators 107 is also supplied with a carrier signal, e.g., a radio frequency uplink carrier signal, generated by the respective corresponding one of carrier signal generators 109. The carrier signals generated by carrier signal generators 109 are phase locked and they have known frequencies and phases. The output of each one of digital to analog (D/A) converters 101 modulates, in its corresponding one of modulators 107, the carrier signal applied to that modulator. Each of the resulting modulated signals, S1RF through SNRF for signals S1 through SN, respectively, and a(t)RF for a(t), is supplied to one of the input ports of Butler matrix 111.

The transfer function of a Butler matrix is an "involutory" transformation. The expression "involutory transformation", as used herein, refers to any function which is its own inverse, e.g., $f(f(x))=x$. Thus, when a set of input signals is operated on by an involutory function to create a first set of output signals, the subsequent performance of that same involutory function on the first set of output signals yields a second set of output signals which are identical to the original set of input signals.

Figure 2:
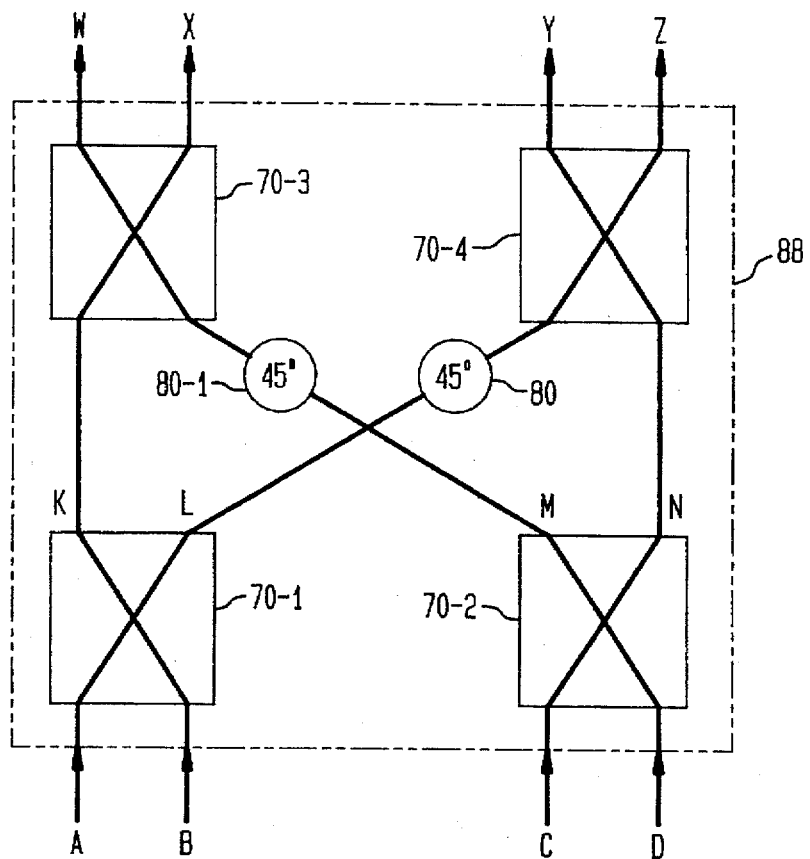
FIG. 2 is a block diagram of an exemplary, prior art 4×4 Butler matrix useable in the system of FIG. 1.

FIG. 2 shows the structure of exemplary 4×4 Butler matrix 88 which can be used as Butler matrix 111 (FIG. 1) or Butler matrix 113 when N=3. Butler matrix 88 (FIG. 2) includes four couplers 70, including couplers 70-1, 70-2, 70-3 and 70-4. Signals A, B, C, and D are supplied as inputs to Butler matrix 88 and signals W, X, Y, and Z are supplied as outputs therefrom.

Figure 3:
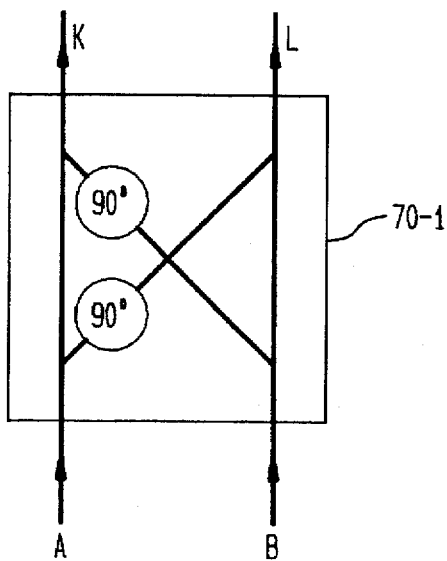
FIG. 3 is a block diagram of an exemplary, prior art coupler used in the 4×4 Butler matrix of FIG. 2.

An exemplary coupler 70-1, shown in FIG. 3, produces two output signals, K and L. Each of output signals K and L is comprised of the sum of each of inputs signal A and B reduced in amplitude by $\sqrt{2}$ and staggered by a phase angle of 90°. Thus, $$K = \frac{A}{\sqrt{2}} < 0° + \frac{B}{\sqrt{2}} < -90° \text{ and } L = \frac{B}{\sqrt{2}} < 0° + \frac{A}{\sqrt{2}} < -90°.$$

As a result, each output signal includes each input signal at half the input power, but at different phases. The 90° relationship holds over the bandwidth of the input signals, i.e., the phase shift through each of couplers 70 is not a function of frequency. Note that couplers 70, which may be implemented in digital or analog form, are well known in the In addition to couplers 70, Butler matrix 88 of FIG. 2 includes two 45° phase shifters 80-1 and 80-2. Phase shifter 80-1 is positioned between couplers 70-1 and 70-4 while phase shifter 80-2 is positioned between couplers 70-2 and 70-3. In this configuration, the signals which pass through the L and M points are shifted by a phase of 45° with respect to the signals which pass through the K and N points. Consequently, the resulting composite Butler matrix output signals W, X, Y, and Z, expressed in terms of Butler matrix input signals A, B, C, and D, are:

$$W = \frac{A}{2} < 0° + \frac{B}{2} < -90° + \frac{C}{2} < -135° + \frac{D}{2} < -225°$$

$$X = \frac{A}{2} < -90° + \frac{B}{2} < -180° + \frac{C}{2} < -45° + \frac{D}{2} < -135°$$

$$Y = \frac{A}{2} < -135° + \frac{B}{2} < -45° + \frac{C}{2} < -180° + \frac{D}{2} < -90°$$

$$Z = \frac{A}{2} < -225° + \frac{B}{2} < -135° + \frac{C}{2} < -90° + \frac{D}{2} < 0°$$

Thus, each signal output from a Butler matrix contains an evenly divided component of each signal input to the Butler matrix but with different phase shifts. Moreover, since the transfer function of a Butler matrix is an involutory transformation, a back-to-back coupling of Butler matrices simply provides as outputs the same signals that were input thereto.

Returning to FIG. 1, the output signals from Butler matrix 111 are supplied to respective ones of amplifiers 115. In this exemplary embodiment of the invention, the gains of amplifiers 115 have a high degree of similarity. Amplifiers 115 increase the magnitude of the signals respectively input thereto and the output amplified signals are supplied as inputs to Butler matrix 113. However, amplifiers 115 do not alter the phase relationship among the output signals.

The signals amplified by amplifiers 115 are applied to the inputs of Butler matrix 113. Butler matrix 113 performs on the amplified signals the same transfer function performed by Butler matrix 111, which was described above. Thus, provided that there was no peaking induced distortion or intermodulation effects, the resulting output signals from Butler matrix 113 are the same as if each of the signals input to Butler matrix 111 had been amplified by its own separate one of amplifiers 115. Also, provided again that there was no peaking induced distortion or intermodulation effects, interposing amplifiers 115 between Butler matrices 111 and 113 effected the same result as if amplifiers 115 were placed after a back-to-back coupling of Butler matrices 111 and 113. Signals S1RF through SNRF are then transmitted via N antennas while signal a(t)RF is discarded, in accordance with an aspect of the invention.

As described above, the signals W, X, Y, and Z are input to amplifiers 115–1, 115–2, 115–3 and 115–4, and they include components of all the separate and distinct input signals A, B, C, and D. As a result of the phase relationship of signals A, B, C, and D, peaking can occur and thereby cause distortion and intermodulation in the outputs from amplifiers 115. It is this peaking that can be reduced by the generation and use of signal a(t). Signal a(t) can be supplied as an input to a power sharing amplification network such as is formed by Butler-matrix 111, amplifiers 115, and Butler-matrix 113 because the modulated version of a(t) is not transmitted from Butler matrix 113 to any antenna, nor does any portion of the modulated version of a(t) combine with any of the modulated signals that are transmitted as outputs from Butler matrix 113. Thus, a component of a(t)RF is supplied as an input to, and can be used to affect the peaking and output of, each of amplifiers 115.

Signal a(t) is constructed by processor 103 as a function of signals S1 through SN. In accordance with the principles of the invention, signal a(t) is generated to reduce the peaking in the signals supplied as inputs to amplifiers 115 and, consequently, to reduce distortion and intermodulation in the amplified signals supplied as outputs by amplifiers 115. In accordance with an aspect of the invention, signal a(t) is generated so as to reduce the peaking experienced at at least one of amplifiers 115, e.g., the one of amplifiers 115 whose input signal peaking results in the highest peak during a particular time period. The peaking, distortion, and intermodulation reduction can be achieved because, as described above, the transfer function of Butler matrix 111 is known to digital signal processor 103 and Butler matrix 111 operates to evenly divide all the signals supplied to each of its inputs among the outputs that it supplies to amplifiers 115. Referring to the expressions for signals W, X, Y, and Z above, the contribution of each of input signals A, B, C, and D is known. Assuming signals A, B, and C to be the input signals S1, S2, and S3, and input signal D to be the specially constructed signal corresponding to a(t), processor 103 can perform a search for those values of a(t) which, when introduced into W, X, Y, and Z, will minimize the peaking at, and intermodulation introduced by, amplifiers 115, in accordance with the invention.

Note, that since the phase of each of the components of the constructed signal a(t) that is input into each of amplifiers 115 is different, signal a(t) cannot eliminate peaking in the input signal supplied to every amplifier. Moreover, signal a(t) has no beneficial effect on peaking when there is only one input signal, i.e., N=1, and instead, in such a case, peaking can only be increased.

However, for two or more input signals, peaking may be reduced in accordance with the principles of the invention. In such a case, for example, peaking reduction signal a(t) may be generated so as to reduce the peaking experienced at at least one of amplifiers 115, e.g., the one of amplifiers 115 whose input signal peaking results in the highest peak during a particular time period, in the following manner.

For each time period, when Butler matrix 111 is an M×M Butler matrix, the lth Butler matrix output signal, $R_l$, i.e., the input to amplifier 115–l, is given by $$R_l = \frac{1}{M} \sum_{i=1}^{M} S_i e^{-j\frac{\pi}{M}(M+1-2i)(l-1)} \quad l=1,\ldots,M$$

where $S_i$ is the ith Butler matrix input signal, $i=1,\ldots,M$. Note that $M \geq N+1$, where N is the number of signals to be amplified and transmitted. If each of the input signals has unity power and arbitrary phase, i.e., $$S_i = e^{j\theta_i}, \theta_i \in [-\pi,\pi] \quad i=1,\ldots,N$$

then the peak that would occur if the peaking reduction signal is not supplied, i.e., if $S_M$ were equal to 0, can be determined by setting $S_M=0$ and calculating the value of $|R_l|^2$ for each value of l from 1 to M. The value of l that produces the greatest value of $|R_l|^2$ corresponds to the Butler matrix output having the highest peak, also known as the "worst peaking", for that time period. Thus, $$\text{peak} = \underset{l}{\text{Max}} |R_l|^2 \quad l=1,\ldots,M.$$

and the worst peaking is present at the lth Butler matrix output having the greatest value.

However, when the peaking reduction signal a(t), defined as $$a(t)=Ae^{j\theta_M}, \text{ where } A \in [0,N] \text{ and } \theta_M \in [-\pi,\pi],$$

is input to the Butler matrix as $S_M$ for minimizing the peaking for a particular set of $S_i$, $i=1, 2, \ldots, N$; the peak is changed to a "new" value because now included within the peak determining formula, Peak=

$$\underset{l}{\text{Max}} |R_l|^2 \quad l=1,\ldots,M,$$

is not necessarily zero value of $S_M$. Thus, if a(t) is properly selected, the value of the peak can be reduced.

This can be done by determining the values of A and $\theta_M$ for $S_M = a(t)$ at each period such that the value of $$\underset{l}{\text{Max}} |R_l|^2 \quad l=1,\ldots,M,$$

is reduced, preferably below the level that would cause distortion and intermodulation. If the input signals $S_i$, $i=1, \ldots, N$, that are desired to be amplified are independent and their $\theta_i$s random, then for each time period: 1) the highest peak assuming a(t) were not to be added is determined; and then 2) a search is undertaken to determine particular values of A and $\theta_M$ which result in a reduction of that peak during that time period. These particular values of A and $\theta_M$ are then used to create a(t).

For example, when N=3, e.g., as in a typical three-sector antenna base station, and M=4, i.e., Butler matrices 111 and 113 are 4×4 Butler matrices, it is necessary to determine the values of A and $\theta_4$, where A $\in$[0,3] and $\theta_4 \in$[−π,π] for a(t) at each period to achieve $$\underset{a(t)}{\text{Min}} \left[ \underset{l}{\text{Max}} |R_l|^2 \right] l = 1, \ldots, M.$$

Using this technique, the maximum power of $N^2/M^2$ which can be supplied from one of the Butler matrix outputs when peaking occurs can be reduced by adding the appropriate a(t). For example, with three signals the maximum power of 9/16 when peaking occurs can be reduced below about 6.25/16 using the appropriate a(t). Thus, in one embodiment of the invention, peaking is reduced by 1.6 dB.

Note that an aspect of the invention is applicant's recognition that adding one or more constructed signals to the input signals that are to be amplified can be used to reduce the peaking, distortion, and intermodulation, which is contrary to the expectation that since adding the extra signals increases the average input power to the amplifiers, it would increase the peaking, distortion, and intermodulation.

Those of ordinary skill in the art will recognize that a(t) can be developed using other criteria than minimizing the signal supplied from the Butler matrix output that would otherwise have the greatest peak. For example, values of a(t) could be sought by searching for values of A and $\theta_M$ such that each Butler matrix output that would otherwise exceed a predetermined level at which distortion and intermodulation occur are reduced below that level without causing any of the other Butler matrix outputs to exceed that level. If such values cannot be found, then the values of A and $\theta_M$ are selected that result in an improved overall system performance, e.g., a reduction of the total distortion and intermodulation, for the given input signals.

Figure 4:
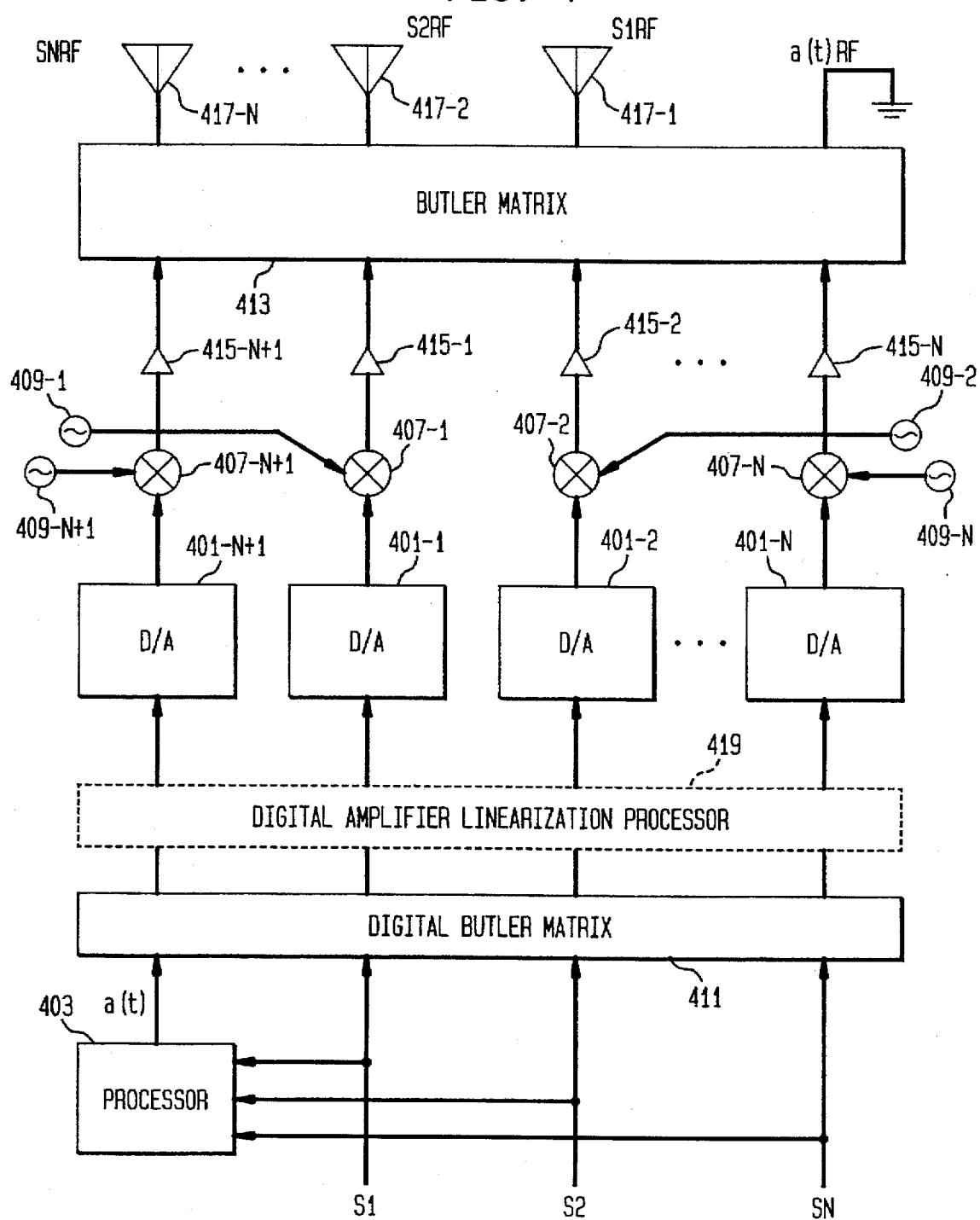
FIG. 4 is a block diagram of an exemplary system embodying the invention in which the first of the Butler matrices is implemented digitally.

In accordance with an aspect of the invention, additional portions of the intermodulation reduction process may be performed digitally, e.g., using a digital implementation of a Butler matrix, by moving the modulation to just after the first, digitally implemented, Butler matrix. One such exemplary embodiment is shown in FIG. 4. Disregarding the difference in series numbering, i.e., 400 versus 100, like numbered components in FIG. 1 and FIG. 4 perform the same general functions. However, Butler matrix 411 is implemented digitally, e.g., on the same digital signal processor implementing digital signal generation processor 403, so that each signal output therefrom contains a digital representation of an evenly divided component of the analog signal represented by each signal input to Butler matrix 411, i.e., S1 through SN and a(t).

The analog versions of the outputs of digital Butler matrix 411, which are baseband signals, are then used to modulate the various carriers 409. The outputs of modulators 407 are thus identical with the outputs of Butler matrix 111 of FIG. 1. Consequently, the resulting output signals S1RF through SNRF produced by passing the modulated carrier signals through amplifiers 415 and Butler matrix 413 are identical to those supplied as outputs from Butler matrix 113 of FIG. 1, provided the gain of amplifiers 115 and 415 are the same.

The signals supplied to digital to analog (D/A) converters 401 may be processed by optional digital amplifier linearization processor 419 so that after conversion to analog, modulation, and amplification, the output of one or more of amplifiers 415 is as if such amplifiers were ideal limiting amplifiers with respect to the digital values supplied as outputs from digital Butler matrix 411. This is possible because optional digital amplifier linearization processor 419 has available to it: a) the value of the signals supplied as outputs by digital Butler matrix 411; b) the transfer functions of amplifiers 415; and c) the frequency and phase of carriers 409. Therefore, given a particular signal supplied as an output from digital Butler matrix 411, optional digital amplifier linearization processor 419 can determine: 1) the value that the corresponding amplifier 415 must output for that signal's corresponding modulated carrier assuming the corresponding amplifier 415 is an ideal limiting amplifier; and 2) the value the corresponding amplifier 415 would actually output for that signal's corresponding modulated carrier as a result of the amplifier's transfer function. When these two values do not match, optional digital amplifier linearization processor 419 recognizes that an amplifier 415 would actually output a nonlinear value. In such a situation, optional digital amplifier linearization processor 419 adjusts the value of the signal supplied to the corresponding one of digital to analog (D/A) converters 401, e.g., by increasing its value, so that the resulting analog output signal modulates the corresponding carrier signal which is input to the corresponding amplifier 415 to drive it to the point of its transfer function that yields the desired ideal linear output value, provided the maximum output power of the amplifier is not exceeded. Optional digital amplifier linearization processor 419 may be implemented on the same digital signal processor implementing digital signal generation processor 403 and Butler matrix 411.

Note again that, so long as there are available Butler matrix ports, additional peaking reduction signals, which are ultimately discarded, may be applied to a power sharing amplification network which includes amplifiers coupled between first and second Butler matrices in an attempt to improve its performance.

Note also that the above described techniques need not be limited to modulated carrier systems.

The foregoing merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A method for amplifying a plurality of baseband input signals using a plurality of amplifiers, the method comprising the steps of:

modulating each one of a plurality of phase locked carrier signals with a corresponding one of said plurality of baseband input signals, each one of said phase locked carrier signals being at a different frequency;

dividing each of the input signals into components from which the original input signals can be reconstructed;

developing a specially constructed signal which is likewise divided into components wherein said specially constructed signal is generated as a function of (i) said baseband signals and (ii) information indicative of the frequencies and phases of said carrier signals;

supplying a component of each of the input signals and a component of the specially constructed signal to at least one of the amplifiers; and constructing amplified versions of the input signals from the outputs of the amplifiers.

2. A method as defined in claim 1 wherein the specially constructed signal is generated so as to reduce otherwise occurring peaking at at least one of the amplifiers during a particular time period.

3. A method as defined in claim 1 wherein, during at least one time period, the components of said input signals and the specially constructed signal are modified so that at least one of the amplifiers, which is supplied with said modified components and is operating beyond its substantially linear region of operation, approximates the operation of an ideal limiting amplifier with respect to said components of said input signals and the specially constructed signal prior to modification.

4. A method as defined in claim 1 wherein each of said amplified versions of the input signals are supplied to a respective one of a plurality of antennas for transmission.

5. A method as defined in claim 4 wherein an amplified version of said constructed signal is not supplied to or transmitted by any of said plurality of antennas.

6. Apparatus for amplifying a plurality of baseband input signals, comprising:

a plurality of modulating means for modulating each one of a plurality of phase locked carrier signals by a corresponding one of said plurality of baseband signals and producing a plurality of modulated input signals, each of said phase locked carrier signals being at a different frequency;

means for dividing each of the modulated input signals into components from which the original input signals can be reconstructed;

means for developing a specially constructed signal which is likewise divided into components wherein said means for developing the specially constructed signal generates the specially constructed signal as a function of (i) said baseband signals and (ii) information indicative of the frequencies and phases of said carrier signals;

a plurality of amplifiers, each for amplifying a component of each of the input signals and a component of the specially constructed signal; and means for constructing amplified versions of the input signals from the outputs of the amplifiers.

7. Apparatus as claimed in claim 6 wherein said means for developing the specially constructed signal develops the specially constructed signal so as to reduce otherwise occurring peaking at at least one of the amplifiers during a particular time period.

8. Apparatus as claimed in claim 6 further including means for modifying, during at least one time period, the components of said input signals and the specially constructed signal supplied so that at least one of the amplifiers, which is supplied with said modified components and is operating beyond its substantially linear region of operation, approximates the operation of an ideal limiting amplifier with respect to said components of said input signals and the specially constructed signal prior to modification.

9. Apparatus as claimed in claim 6 further including a plurality of antennas and wherein each of said amplified versions of the input signals are supplied to a respective one of said antennas for transmission.

10. Apparatus as claimed in claim 9 wherein an amplified version of said constructed signal is not supplied to or transmitted by any of said antennas.

11. Apparatus for amplifying N input signals to produce N output signals, each of said N output signals being an amplified version of a respective one of said input signals, where N is greater than one, the apparatus comprising:

a first Butler matrix having N+1 input ports and N+1 output ports, N of said input ports each receiving one of said N input signals;

N+1 amplifiers, each having an input port and an output port, the input port of each of said amplifiers being coupled to a respective one of said N+1 output ports of said first Butler matrix;

a second Butler matrix having N+1 input ports and N+1 output ports, each of said N+1 input ports of said second Butler matrix being coupled to the output port of a respective one of said amplifiers, N of said output ports of said second Butler network supplying said N output signals; and a peaking reduction signal generator which supplies a peaking reduction signal to said input port of said first Butler matrix that is not receiving one of said N input signals, said peaking reduction signal being generated as a function of said N input signals.

12. The invention as defined in claim 11 wherein said peaking reduction signal is generated to reduce otherwise occurring peaking at at least one of said amplifiers during a particular time period.

13. The invention as defined in claim 11 wherein said peaking reduction signal is generated so as to reduce the peaking at a one of said amplifiers which would otherwise have a maximum peak during a particular time period.

14. The invention as defined in claim 11 wherein said peaking reduction signal generator includes a digital signal processor.

15. The invention as defined in claim 11 wherein said N input signals are developed by modulating N different frequency carrier signals by a respective one of N baseband signals.

16. The invention as defined in claim 15 wherein each of said N baseband signals are developed from a respective one of N digital signals.

17. The invention as defined in claim 16 wherein said peaking reduction signal generator receives said N digital signals as an input.

18. The invention as defined in claim 17 wherein said peaking reduction signal generator includes a digital signal processor that generates a digital peak reducing signal from which said peaking reduction signal is generated by converting said digital peak reducing signal to an analog baseband peak reducing signal and then modulating a carrier signal using said analog baseband peak reducing signal.

19. The invention as defined in claim 17 wherein said peaking reduction signal generator generates said peaking reduction signal as a function of: (i) said N digital signals and (ii) phase and frequency information for said carrier signals.

20. Apparatus for amplifying N input signals to produce N output signals corresponding to said N input signals, where N is an integer greater than one, each of said N output signals being an amplified version of a respective one of said N input signals, the apparatus comprising:

means responsive to said N input signals for generating a peaking reduction signal;

means responsive to said N input signals and to said peaking reduction signal for performing an involutory transform on said N input signals and said peaking reduction signal and for supplying as an output M output signals, where M is equal to or greater than N+1 and less than 2N, each of said M output signals containing a component of each of said N input signals and said peaking reduction signal;

M means for amplifying, each being coupled to receive as an input a respective one of said M output signals supplied from said first involutory transform means and each for supplying as an output an amplified version of said M output signals; and means for performing an involutory transform on said amplified M output signals, and for supplying as an output amplified versions of said N input signals and an amplified version of said peaking reduction signal.

21. The apparatus as claimed in claim 20 wherein said peaking reduction signal includes a plurality of signals and wherein M equals N plus the number of signals that are included in said peaking reduction signal.

22. The apparatus as claimed in claim 20 wherein each of said means for performing involutory transforms are Butler matrices having an order greater than 2×2.

23. The apparatus as claimed in claim 20 wherein said means for generating said peaking reduction signal generates said peaking reduction signal to reduce otherwise occurring peaking at at least one of said amplifiers during a particular time period.

24. The apparatus as claimed in claim 20 wherein said means for generating said peaking reduction signal generates said peaking reduction signal so as to reduce the peaking at a one of said amplifiers which would otherwise have a maximum peak during a particular time period.

25. The apparatus as claimed in claim 20 wherein said first means for performing an involutory transform on said N input signals performs said transform digitally.

26. The apparatus as claimed in claim 20 wherein said N input signals are derived by modulating each of N carrier signals by a respective one of N baseband signals.

27. The apparatus as claimed in claim 26 wherein said means for generating a peaking reduction signal generates said peaking reduction signal as a function of said N baseband signals.

28. The apparatus as claimed in claim 26 wherein said means for generating receives said N baseband signals in digital form.

29. Apparatus for amplifying N input signals to produce N output signals, where N is greater than one, each of said N output signals corresponding to a respective one of said input signals, the apparatus comprising:

a first Butler matrix having N+1 input ports and N+1 output ports, N of said input ports each receiving one of said input signals;

N+1 amplifiers, each of said amplifiers being arranged to amplify a received version of a respective one of said N+1 signals supplied as an output from said first Butler matrix;

a second Butler matrix having N+1 input ports and N+1 output ports, each of said N+1 input ports of said second Butler matrix receiving a respective one of said amplified versions of said signals supplied as outputs from said N+1 amplifiers, N of said output ports of said second Butler network supplying said N output signals; and a peaking reduction signal generator, said peaking reduction signal being (i) supplied to the input port of said first Butler matrix that is not receiving one of said N input signals, and (ii) being generated as a function of said N input signals to reduce the otherwise resulting intermodulation in said N output signals.

30. The invention as defined in claim 29 wherein said peaking reduction signal is generated to reduce otherwise occurring peaking at at least one of said amplifiers during a particular time period.

31. The invention as defined in claim 29 wherein said peaking reduction signal is generated so as to reduce the peaking at a one of said amplifiers which would otherwise have a maximum peak during a particular time period.

32. The invention as defined in claim 29 further including linearizing means for modifying at least one of said signals supplied from said first Butler matrix so that at least one of said amplifiers approximates operation of an ideal limiting amplifier with respect to said signal supplied from said first Butler matrix during a particular time period when said at least one of said amplifiers is operating beyond its substantially linear region.

33. The invention as defined in claim 29 further including N+1 modulators, each of said N+1 modulators (i) receiving one of said N+1 output signals from a respective one of said first Butler matrix output ports and (ii) employing said received one of said N+1 output signals to modulate a respective carrier signal that is also input thereto so as to produce a modulated carrier signal which is supplied as said version of a respective one of said N+1 signals supplied as an output from said first Butler matrix that is received as an input by said amplifiers.

34. The invention as defined in claim 33 wherein said first Butler matrix is implemented digitally and further comprising N+1 digital to analog converters each of which receives one of said outputs of said first Butler matrix and develops an analog signal corresponding thereto which is then supplied for use as the version of said input signal supplied to said amplifier.

35. The invention as defined in claim 33 wherein each of said carrier signals has a distinct frequency and said carrier signals are phase locked.

36. The invention as defined in claim 29 wherein said first Butler matrix is implemented digitally and further comprising:

N+1 digital to analog converters each of which receives one of said outputs of said first Butler matrix and develops an analog signal corresponding thereto; and N+1 modulators, each of said N+1 modulators (i) receiving a respective one of said N+1 analog signals and (ii) employing said received one of said N+1 output signals to modulate a respective carrier signal that is also input thereto, so as to produce a modulated carrier signal which is supplied as said version of a respective one of said N+1 signals supplied as an output from said first Butler matrix that is received as an input by said amplifiers.

37. Apparatus comprising:

first and second Butler matrices having an order greater than 2×2;

a plurality of amplifiers; and a peaking reduction signal generator;

wherein (i) said first Butler matrix receives as inputs a plurality of input signals for amplification and transmission as well as at least a peaking reduction signal supplied as an output from said peaking reduction signal generator, (ii) a version of each output of said first Butler matrix is amplified by a respective one of said plurality of amplifiers, and (iii) said second Butler matrix receives as an input the outputs of said amplifiers and supplies as an output at least amplified versions of said input signals for amplification and transmission.

38. The invention as defined in claim 37 wherein said versions of each of the outputs of said first Butler matrix that are amplified by a respective one of said plurality of amplifiers are developed by using each of said outputs of said first Butler matrix to modulate a respective carrier signal.

39. The invention as defined in claim 37 wherein said peaking reduction signal is generated so as to reduce otherwise occurring peaking at at least one of said amplifiers during a particular time period.

40. The invention as defined in claim 37 wherein said peaking reduction signal is generated to reduce the peaking at a one of said amplifiers which would otherwise have a maximum peak during a particular time period.

41. The invention as defined in claim 37 wherein said peaking reduction signal is generated as a function of said plurality of input signals for amplification and transmission.

42. Apparatus for amplifying N input signals to produce N output signals corresponding to said N input signals, where N is an integer greater than one, each of said N output signals being an amplified version of a respective one of said input signals, the apparatus comprising:

means responsive to said N input signals for generating a peaking reduction signal;

first means for performing an involutory transform on said N input signals and said peaking reduction signal and for supplying as an output [N+1] M output signals, where M is equal to or greater than N+1 and less than 2N, and at least one of said [N+1] M output signals containing a component of (i) at least one of said input signals and (ii) said peaking reduction signal;

[N+1] M means for amplifying, each being coupled to receive as an input a respective one of said [N+1] M output signals supplied from said first involutory transform means and supplying as an output an amplified version of said [N+1] M output signals; and second means for performing an involutory transform on said amplified [N+1] M output signals, and for supplying as an output amplified versions of said N input signals and an amplified version of said peaking reduction signal.

* * * * *